United States Patent
Bausov et al.

(10) Patent No.: US 6,993,302 B2
(45) Date of Patent: Jan. 31, 2006

(54) CLASS-L POWER-OUTPUT AMPLIFIER

(76) Inventors: Igor Bausov, 313 S. Fifth St., Raton, NM (US) 87740; Larry G. Stolarczyk, 848 Clayton Hwy., Raton, NM (US) 87740

( * ) Notice: Subject to any disclaimer, the term of this patent is extended or adjusted under 35 U.S.C. 154(b) by 0 days.

(21) Appl. No.: 11/062,241

(22) Filed: Feb. 22, 2005

(65) Prior Publication Data

US 2005/0159117 A1    Jul. 21, 2005

Related U.S. Application Data

(63) Continuation-in-part of application No. 10/046,793, filed on Jan. 15, 2002, now abandoned.

(51) Int. Cl.
*H04B 1/04* (2006.01)
(52) U.S. Cl. .............. 455/127.1; 455/127.2; 455/127.3; 455/91; 330/295
(58) Field of Classification Search ........... 455/127.1, 455/127.2, 127.3, 127.4, 127.5, 91; 330/127, 330/10, 297, 251, 255
See application file for complete search history.

(56) References Cited

U.S. PATENT DOCUMENTS

| | | | | |
|---|---|---|---|---|
| 6,072,331 A | * | 6/2000 | Takizawa | 330/251 |
| 6,072,361 A | * | 6/2000 | Myers et al. | 330/251 |
| 6,781,422 B1 | * | 8/2004 | Yang | 330/297 |
| 2002/0113655 A1 | * | 8/2002 | Lautzenhiser et al. | 455/127.1 |

* cited by examiner

*Primary Examiner*—Lana Le
(74) *Attorney, Agent, or Firm*—Richard B. Main

(57) ABSTRACT

A radio power output amplifier comprises a balanced radio power output that differentially drives a dipole antenna or other balanced load. One half of the differential power output drives one side of the antenna from ground to the maximum positive rail, while the other half of the differential power output drives the opposite side of the antenna from the maximum positive rail to ground. The result is a voltage swing across the antenna that is twice that which would occur if a single ended output was driving an unbalanced load. Since the power output is the square of the voltage divided by the load impedance, the result is four times the power output.

8 Claims, 2 Drawing Sheets

CLASS-L POWER-OUTPUT AMPLIFIER

RELATED APPLICATION

Figure 1:
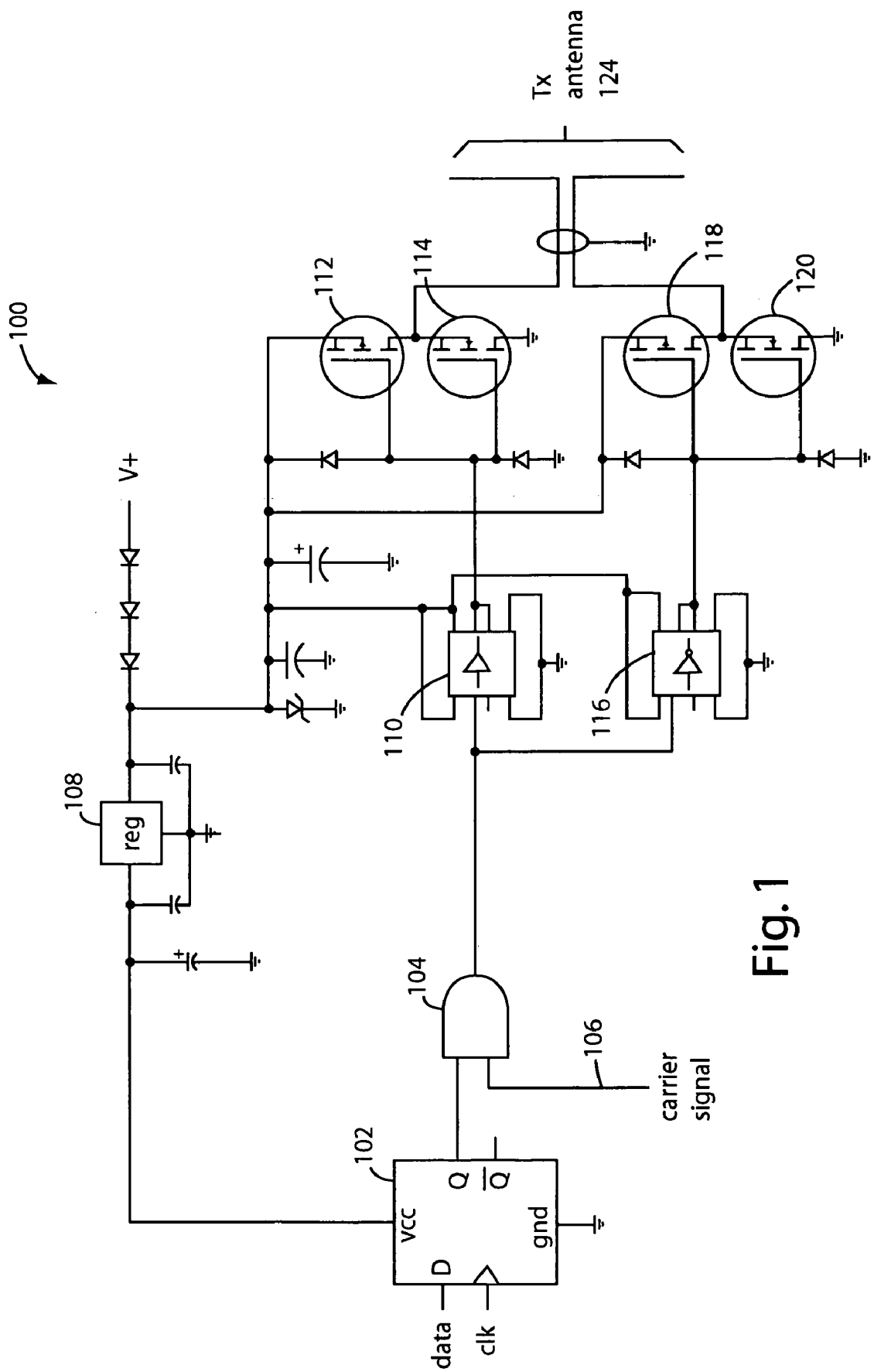

This is a continuation-in-part of U.S. patent application Ser. No. 10/046,793, filed Jan. 15, 2002, now abandoned and titled CLASS-L RADIO POWER-OUTPUT AMPLIFIER, and which was issued a Notice of Allowance on Dec. 27, 2004.

FIELD OF THE INVENTION

The present invention relates to amplifiers and radio transmitters, and more particularly to methods and circuits for deriving more radio power output to the antenna for a given power supply voltage.

DESCRIPTION OF THE PRIOR ART

Much of the power consumed in portable, battery-powered electronic devices is consumed by the output stages. In a transmitter, the radio power output amplifier takes a large percentage of the total power draw. In receivers, its the audio power output amplifier that drives the speakers.

If an amplifier is biased such that 360° of the signal gets amplified through, the amplifier is classified as a Class-A type. Such Class-A biasing helps produce the best signal fidelity and least distortion, but the amplifier is always drawing power even during quiescent periods. These amplifiers operate in the center of the linear transfer characteristic.

So Class-B amplifiers were developed that are biased so that 180° of the signal gets amplified through, and two such amplifiers are typically arranged in push-pull configuration for the least distortion. Class-B amplifiers operate just at the cutoff end of the linear transfer characteristic. A Class-AB amplifier uses a modified bias that puts the operation just a little bit up from the cutoff end of the linear transfer characteristic.

Radio power output amplifiers are typically biased for Class-C operation. Without any input signal, the amplifier is cut off. The audio or video modulation is applied in later stages, or is otherwise immune to the signal distortion of the carrier excitation caused by Class-C operation. The input signal to a Class-C amplifier is strong enough to immediately drive it into saturation, therefore the Class-C amplifier deliberately operates between cutoff and saturation.

A so-called Class-D operation appeared a few years ago that uses pulse-width modulation (PWM) to drive an output load, especially in large audio amplifiers that are driving 100+ watt sub-woofers. Such Class-D operation allows cooler operation, smaller power supplies, and less expensive power-output transistors. The operation is similar to that of a switching power supply, where the output stages are switched between cutoff and saturation and never do operate in any part of the linear transfer characteristic.

For example, Texas Instruments (Dallas, Tex.) introduced the TPA005D02 Class-D audio power amplifier (APA) in 1998. These integrated circuits were designed to reduce power requirements in portable personal computers, wireless phones, portable music systems, etc. The Class-D APA is said to be three times more efficient than Class-AB APA's. The Texas Instrument devices are claimed to provide 0.5% total harmonic distortion into a 4-ohm load from a 5-volt power supply.

A Class-E power amplifier is described by Nathan and Alan Sokal, in U.S. Pat. No. 3,919,656, issued Nov. 11, 1975, (Sokal '656). Such comprises a high efficiency tuned switching power amplifier that depends on a resonant load network. The output driver transistor is only switched between on and off, and so very little power is dissipated in the device as heat. Sokal '656 provides a good description of the conventional types of power amplifiers useful in battery-operated RF-transmitting devices, and is incorporated herein by reference.

Glen Griffith describes a Class-E power amplifier used in an RF-telemetry transmitter in U.S. Pat. No. 6,073,050, issued Jun. 6, 2000, (Griffith '050). A pulse-width modulator provides the transmitter modulation. An implantable telemetry device is described, in which power and data are both inductively coupled into the implant. Griffith '050 provides a good description of battery-operated RF-transmitting telemetry devices, and is incorporated herein by reference.

The basic power output of a single-ended power amplifier will be the operating voltage squared divided by the load impedance, e.g., $$P = \frac{E^2}{Z}.$$

In battery-operated devices, the battery voltage very much limits the basic power output of a single-ended amplifier. Especially if inductors and transformers are being eliminated in the design. If a 6-volt battery voltage was being used directly in a radio transmitter power output amplifier, the most the output stage could produce would be 0.72 watts, e.g., into a 50-ohm load $$\left(P = \frac{6^2}{50}\right).$$

But if the power supply voltage was doubled to 12-volts, then the power output would quadruple to 2.88 watts, into the same 50-ohm load $$\left(P = \frac{12^2}{50}\right).$$

SUMMARY OF THE INVENTION

It is therefore an object of the present invention to provide a radio transmitter with four times the power output of a conventional one, given the same operating voltage.

It is another object of the present invention to provide a radio transmitter that is able to operate in a drill-string radar application.

It is a still further object of the present invention to provide a "Class-L" power amplifier that does not depend on expensive and bulky inductors and transformers to produce a high power RF-output from a battery-operated device.

Briefly, a radio power output amplifier embodiment of the present invention comprises a balanced radio power output that differentially drives a dipole antenna or other balanced load. One half of the differential power output drives one side of the antenna from ground to the maximum positive rail, while the other half of the differential power output drives the opposite side of the antenna from the maximum positive rail to ground. The result is a voltage swing across the antenna that is twice that which would occur if a single ended output was driving an unbalanced load. Since the power output is the square of the voltage divided by the load impedance, the result is four times the power output.

An advantage of the present invention is that a radio transmitter is provided for efficient battery operation.

Another advantage of the present invention is that a "Class-L" power amplifier is provided that outputs four-times the radiated power of a conventional single-ended output stage.

These and other objects and advantages of the present invention will no doubt become obvious to those of ordinary skill in the art after having read the following detailed description of the preferred embodiments which are illustrated in the various drawing figures.

IN THE DRAWINGS

Figure 2:
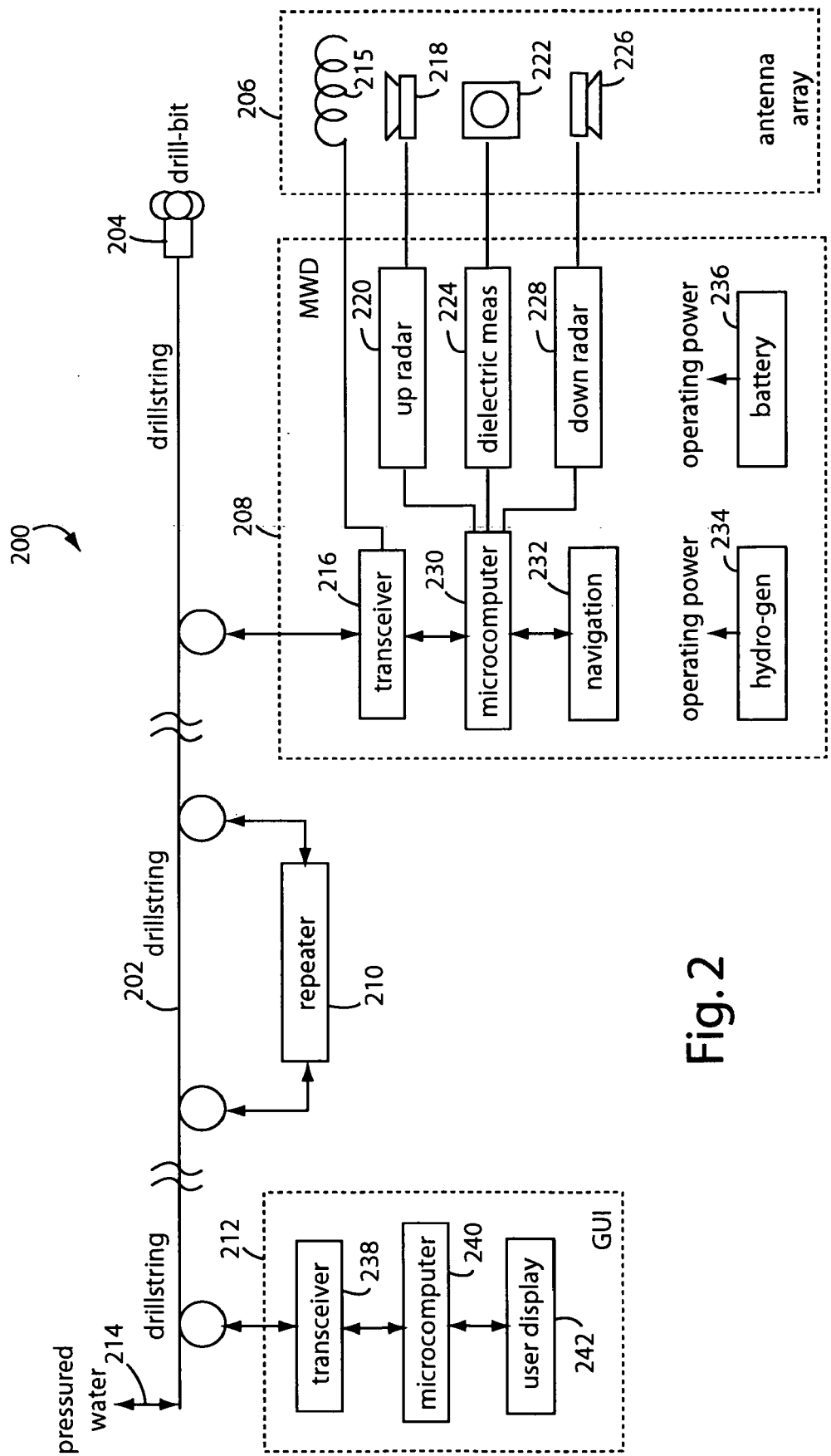

FIG. 1 is a schematic diagram of a radio-transmitter power-output amplifier for use in a wireless telemetry device; and FIG. 2 is a block diagram of a wireless telemetry device useful in coal mining that includes the radio-transmitter power-output amplifier of FIG. 1

DETAILED DESCRIPTION OF THE PREFERRED EMBODIMENT

FIG. 1 illustrates a radio-transmitter power-output amplifier embodiment of the present invention, and is referred to herein by the general reference numeral 100. The amplifier 100 comprises a D-type flip-flop 102 that accepts data input modulation and clocks, a logic AND-gate 104 for gating through a radio carrier input 106 according to the modulation, and a three-terminal voltage regulator 108 that provides operating power to the digital logic. A MOSFET-driver 110 drives a totem-pole arrangement of two power MOSFET's 112 and 114. An inverting MOSFET-driver 116 drives another totem-pole arrangement of two power MOSFET's 118 and 120. Taken altogether, the MOSFET-drivers and the four MOSFET's implement a digital, differential drive radio power output. A balanced transmission line 122 connects the output to an antenna 124.

In one implementation that worked well, the MOSFET-driver 110 was a Maxim Integrated Products (Sunnyvale, Calif.) MAX4420CSA, the inverting MOSFET-driver 116 was a MAX4429CSA, the MOSFET's 112 and 118 were International Rectifier (El Segundo, Calif.) IRF9540N HEXFET Power MOSFET's, and the MOSFET's 114 and 120 were IFR640 HEXFET Power MOSFET's.

In many applications, the V+ power rail will be directly connected to a battery, e.g., 6-volts or 12-volts. The differential output drive of amplifier 100 results in twice the voltage swing at antenna 124 than would otherwise be possible with a single-ended output. The power output is therefor increased as the square of the voltage, divided by the load impedance. On one-half of each carrier cycle, the top dipole part of the antenna will be V+ relative to the bottom dipole part. On the next one-half of the carrier cycle, the top dipole part of the antenna will be –(V+) relative to the bottom dipole part. The peak-to-peak swing is therefor 2*(V+).

FIG. 2 shows an application in which the amplifier 100 (FIG. 1) is especially useful. A drillstring mining system embodiment of the present invention is referred to herein by the general reference numeral 200. The drillstring mining system 200 comprises a long drillstring of water-filled pipes 202 that are used in directional drilling, e.g., horizontal drilling through coalbed deposits. A drill head 204 can be controlled to go left-right, up-down as it advances underground while boring. An antenna array 206 and a measure-while-drilling (MWD) unit 208 are attached to the drill head 204. They communicate over a radio channel back to the user above ground via the metal pipe in the drillstring 202. If the drillstring 202 is very long, a radio repeater 210 is needed to help boost the radio communication signals. A graphic user interface 212 is provided for the user. Pressurized water 214 is pumped into the drillstring 202 to circulate and remove drilling material from the drill head 204.

The antenna array 206 includes a loop antenna 215 connected to a radio transceiver 216 in MWD 208. Such radio transceiver 216 preferably includes the amplifier 100 (FIG. 1). An up-looking radar antenna 218 is connected to an up-radar unit 220 and is used to gauge the coalbed thickness above the drill head 204. A microwave patch antenna 222 is connected to a dielectric measurement unit 224 that assesses the dielectric constant of the material surrounding the drill head 204. A down-looking radar antenna 226 is connected to a down-radar unit 228 and is used to gauge the coalbed thickness below the drill head 204. A microcomputer 230 calculates the coalbed thickness and dielectric constant from the measurements provided. A navigation device 232 receives commands from the user and causes the drill head 204 to advance left-right, and up-down.

The electronics of MWD 208 derives its operating power either from a miniature hydro-electric generator 234 or a battery 236, or both. The hydro-electric generator 234 is driven by the water flow in the drillstring 202 that results from the pressurized water 214. The battery 236 is used to maintain operation when the hydro-electric generator 234 is not being driven by a water flow.

The GUI 212 includes a transceiver 238 to communicate with the repeater 210 and the transceiver 216 over the drillstring 202. A microcomputer 240 converts data received from the MWD 208 into useful user information on a display 242. The user is presented with data that allows various navigation decisions to be made, as well as an assessment of the coalbed reserves and formation geometries.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the "true" spirit and scope of the invention.

What is claimed is:

1. A method for increasing the signal power output of an amplifier, the method comprising the steps of:
   differentially driving a balanced load from two pairs of totem-pole transistors;
   driving each of the two pairs of totem-pole transistors oppositely; and
   taking a signal output from each of the junctions of the two pairs of totem-pole transistors.

2. A radio power-output amplifier, comprising:
   a first totem-pole arrangement of power output transistors for pulling a first antenna output connection between ground and a battery voltage level;
   a second totem-pole arrangement of power output transistors for pulling a second antenna output connection between ground and said battery voltage level;

a buffer for driving the first totem-pole arrangement of power output transistors according to a radio-carrier input signal; and an inverting buffer for driving the second totem-pole arrangement of power output transistors opposite to said radio-carrier input signal.

3. The radio power-output amplifier of claim 2, further comprising:

a D-flip-flop connected to receive input data and for modulating said radio-carrier input signal.

4. The radio power-output amplifier of claim 2, further comprising:

a balanced transmission line connected at a first end to said first and second antenna output connections; and a transmitting antenna connected to a second end of the balanced transmission line and providing for radio emissions of a modulated radio carrier signal.

5. A method for increasing the radio power output of a transmitter, the method comprising the steps of:

differentially driving a balanced antenna from two pairs of totem-pole transistors;

driving each of the two pairs of totem-pole transistors oppositely; and taking a radio transmitter output from each of the junctions of the two pairs of totem-pole transistors.

6. A directional drillstring system, comprising:

a drillstring providing for underground boring and further providing a radio communication path;

a drillhead mounted at a distal end of the drillstring and providing for drilling;

a radio transceiver associated with the drillhead and providing for radio transmissions of drillhead activity and underground geology data;

wherein, the radio transceiver includes a radio power-output amplifier, comprising:

a first totem-pole arrangement of power output transistors for pulling a first antenna output connection between ground and a battery voltage level;

a second totem-pole arrangement of power output transistors for pulling a second antenna output connection between ground and said battery voltage level;

a buffer for driving the first totem-pole arrangement of power output transistors according to a radio-carrier input signal; and an inverting buffer for driving the second totem-pole arrangement of power output transistors opposite to said radio-carrier input signal.

7. The directional drillstring system of claim 6, wherein the radio transceiver includes said radio transmitter further having:

a D-flip-flop connected to receive input data and for modulating said radio-carrier input signal;

a balanced transmission line connected at a first end to said first and second antenna output connections; and a transmitting antenna connected to a second end of the balanced transmission line and providing for radio emissions of a modulated radio carrier signal.

8. A radio transmitter, comprising:

means for differentially driving a balanced antenna from two pairs of totem-pole transistors;

means for driving each of the two pairs of totem-pole transistors oppositely; and means for taking a radio transmitter output from each of the junctions of the two pairs of totem-pole transistors.

* * * * *